(12) United States Patent
von Schwerin et al.

(10) Patent No.: US 6,407,945 B2
(45) Date of Patent: Jun. 18, 2002

(54) METHOD FOR READING NONVOLATILE SEMICONDUCTOR MEMORY CONFIGURATIONS

(75) Inventors: Andreas Graf von Schwerin, München; Oskar Kowarik, Neubiberg; Franz Schuler, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/805,297

(22) Filed: Mar. 13, 2001

(30) Foreign Application Priority Data

Mar. 13, 2000 (DE) .......................................... 100 12 105

(51) Int. Cl.$^7$ .............................................. G11C 16/04
(52) U.S. Cl. .............................. 365/185.18; 365/185.24; 365/185.27
(58) Field of Search ........................ 365/185.24, 185.18, 365/185.27

(56) References Cited

U.S. PATENT DOCUMENTS 6,147,903 A * 11/2000 Takahashi .............. 365/185.05

* cited by examiner

*Primary Examiner*—A. Zarabian
(74) *Attorney, Agent, or Firm*—Laurence A. Greenberg; Werner H. Stemer; Ralph E. Locher

(57) ABSTRACT

A method for reading non-volatile semiconductor memory configurations includes determining a high threshold voltage and a low threshold voltage based on a charge state of a floating gate for a transistor, and applying a reverse bias between a bulk and a source of the transistor during reading.

6 Claims, 2 Drawing Sheets

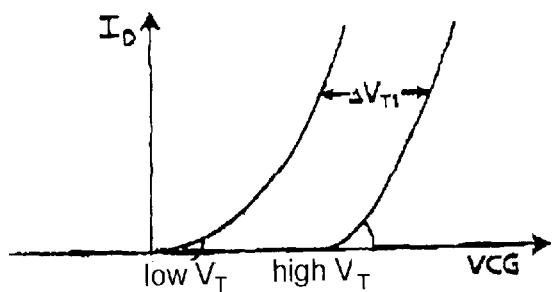
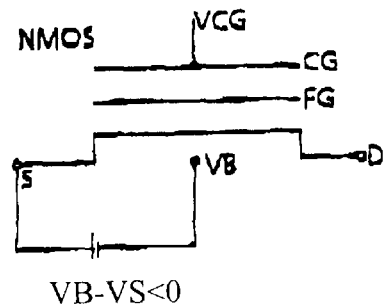
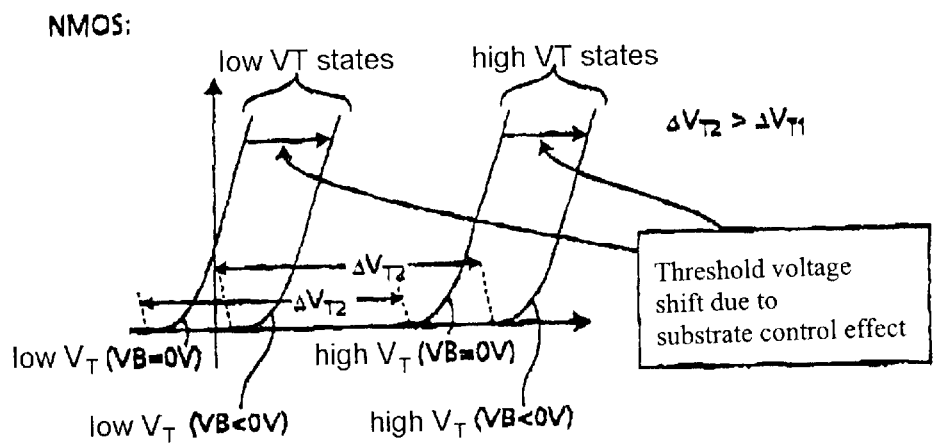
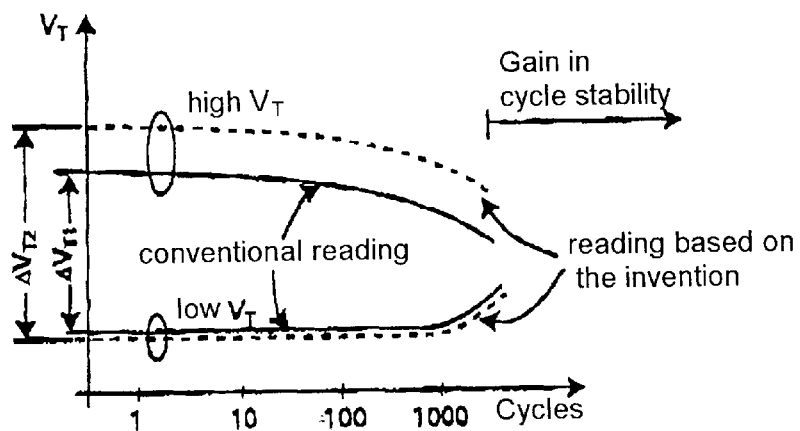

METHOD FOR READING NONVOLATILE SEMICONDUCTOR MEMORY CONFIGURATIONS

BACKGROUND OF THE INVENTION

Field of the Invention

The invention lies in the field of semiconductors. The invention relates to a method for reading nonvolatile semiconductor memory configurations in which a high threshold voltage and a low threshold voltage are determined based on the charge state of a floating gate for a transistor.

In semiconductor memory configurations using, as memory cells, MOS transistors with a control gate and a floating gate, a leakage current problem arises. This problem can also be called the "moving bit problem", or MB problem for short. In the MB problem, the floating gate loses its charge due to very small leakage currents over long times, which means there exists a limited data holding property. Because the leakage currents are exponentially dependent on the electrical field over the silicon dioxide insulation layer in which the floating gate is embedded, a marked reduction in the leakage currents can be expected if the electrical fields are successfully reduced to a large extent in the zero-current state of the semiconductor memory configuration. As a consequence, the threshold voltages $V_T$ in the high $V_T$ state and in the low $V_T$ state of the transistor should also be as low as possible. The threshold voltages are known to stipulate the memory state of the transistor by virtue of high $V_T$ and low $V_T$ logic states being assigned to "0" and "1", or vice-versa.

Another general problem with nonvolatile semiconductor memory configurations is that identical memory cells can have different programming speeds due to variations in technology, for example, when they are manufactured. As a result, different threshold voltages may arise for the transistors in these memory cells.

When reading nonvolatile semiconductor memory configurations, the aforementioned logic states high $V_T$ or high threshold voltage and low $V_T$ or low threshold voltage of the transistor need to be distinguished for each of the individual cells. For reliable reading, the difference between the two threshold voltages high $V_T$ and low $V_T$ should be as large as possible. The difference cannot be increased arbitrarily, however, because the level of the high $V_T$, i.e., the high threshold voltage, state is determined by the negative (for NMOS) or positive (for PMOS) quantity of charge that can be applied to the floating gate of the transistor, and hence is limited by the available voltages. The difference cannot be increased arbitrarily also because the low threshold voltage low $V_T$ must always be higher than 0 V (for NMOS) or lower than 0 V (for PMOS) due to the fact that the transistor would otherwise be normally on, even when not selected.

For the aforementioned leakage current problem, there is still no satisfactory solution at present. The only factor being considered is the use of a UV shift, i.e., raising the threshold voltage in the zero-charge state, that is to say, after discharge by UV irradiation, to reduce electrostatic fields over the oxide insulation layer.

Different programming speeds of the individual memory cells can be allowed for, per se, by intelligent programming, where each memory cell is allocated its required threshold voltage. However, such a procedure is extremely time consuming and requires greater effort for construction and in the peripheral area.

Negative (for NMOS) or positive (for PMOS) threshold voltages for low $V_T$ can be prevented by using the aforementioned intelligent programming to check the respective threshold voltage reached to prevent it from falling below (for NMOS) or rising above (for PMOS) the 0 V limit. Such intelligent programming places additional demands on the construction of the circuit. Finally, connecting a selection transistor upstream in addition to the transistor can also prevent a flow of current, even if the transistor, that is to say the actual memory cell, is over-programmed and becomes normally on. Such an additional selection transistor significantly increases the chip area required, however, and is, therefore, extremely cost intensive.

SUMMARY OF THE INVENTION

It is accordingly an object of the invention to provide a method for reading nonvolatile semiconductor memory configurations that overcomes the hereinafore-mentioned disadvantages of the heretofore-known devices and methods of this general type and that, while overcoming the leakage current problem, ensures a large difference between the threshold voltages, of which low $V_T$ can even assume negative (for NMOS) or positive (for PMOS) values.

The objectives of the invention are achieved by applying a reverse bias between the bulk and the source of the transistor.

With the foregoing and other objects in view, there is provided, in accordance with the invention, a method for reading non-volatile semiconductor memory configurations including determining a high threshold and a low threshold voltage based on a charge state of a floating gate for a transistor, and applying a reverse bias between a bulk and a source of the transistor during reading.

In accordance with another mode of the invention, the low threshold voltage is allowed to assume negative voltage values for NMOS transistors and to assume positive voltage values for PMOS transistors.

In accordance with a further mode of the invention, applying the reverse bias expands the window between the high threshold voltage and the low threshold voltage.

In accordance with an added mode of the invention, the window between the high threshold voltage and the low threshold voltage is left constant by applying the reverse bias.

In accordance with an additional mode of the invention, by applying the bias, a threshold voltage for NMOS transistors is shifted by $\gamma(\sqrt{-V_{SB}+2\phi_f}-\sqrt{2\phi_f})$ and a threshold voltage for PMOS transistors is shifted by $-\gamma(\sqrt{V_{SB}-2\phi_f}-\sqrt{-2\phi_f})$ by applying the bias, where $\gamma$ is the substrate control factor and $\phi_f$ is the Fermi voltage of the bulk.

The inventive method for reading memory cells in a nonvolatile semiconductor memory configuration is based on the utilization of the substrate control effect, described as follows: when a reverse bias $V_{SB}$ is applied between the bulk and the source of an NMOS or PMOS transistor, the threshold voltage thereof is shifted by:

$$\gamma(\sqrt{-V_{SB}+2\phi_f}-\sqrt{2\phi_f}),$$

where $V_{SB}<0$ and $\phi_f>0$ for NMOS, and $$-\gamma(\sqrt{V_{SB}-2\phi_f}-\sqrt{-2\phi_f}),$$

where $V_{SB}>0$ and $\phi_f<0$ for PMOS, $\gamma$=substrate control factor, and $\phi_f$=Fermi voltage of the bulk, that is to say, Fermi voltage of p-conductive or n-conductive silicon.

Thus, applying the reverse bias $V_{SB}$ between the bulk and the source allows an inherently normally-on memory cell having a negative (for NMOS) or positive (for PMOS) threshold voltage for a bulk voltage of 0 V to be off even with a positive (for NMOS) or negative (for PMOS) gate voltage.

In accordance with a concomitant mode of the invention, the drain and the source of the transistor are each placed at different potentials when the reverse bias has been applied.

The method according to the invention allows a series of significant advantages that cannot be readily achieved with the prior art.

First, if the distance between the high threshold voltage high $V_T$ and the low threshold voltage low $V_T$, that is to say, the $V_T$ window, is left the same, then the high threshold voltage high $V_T$ can be lowered. Accordingly, if no external voltages are applied to the semiconductor memory configuration, a smaller electrical field exists over the silicon dioxide insulation layer in the high threshold voltage high $V_T$ state, which results in smaller leakage currents, in other words, in a lower leakage current susceptibility.

Second, lowering the relatively high threshold voltage high $V_T$ has the advantage that lower voltages are sufficient for the transfer to the high $V_T$ state in the transistor, which permits information to be erased in a memory cell array using relatively low voltages.

Third, the state of the low threshold voltage low $V_T$ is no longer limited by 0 V. Thus, negative (for NMOS) and positive (for PMOS) threshold voltages also become possible, which results in an increase in the size of the $V_T$ window when the high threshold voltage high $V_T$ is retained. Thus, relatively high cycle numbers can be achieved for the semiconductor memory configuration or its memory cells.

Fourth, the relatively large $V_T$ window or the relatively large difference between the high threshold voltage high $V_T$ and the low threshold voltage low $V_T$ allows, for example, technology-related variations in the threshold voltage to be tolerated for the low $V_T$ state and/or for the high $V_T$ state within a certain frame. Accordingly, it is possible to dispense with monitoring the threshold voltage during programming, which permits a simpler circuit construction. Intelligent programming both allows exact setting of the threshold voltage and makes it possible to prevent a normally-on state. The exact setting of the threshold voltage prevents variations due to different programming speeds.

Fifth, an enlarged $V_T$ window results in improved applications for the nonvolatile semiconductor memory configuration with more levels because the individual states arising in the place of high $V_T$ and low $V_T$ are more reliable to read. For example, a 2-bit cell can have four states.

Sixth, an enlarged $V_T$ window results in a higher level of cycle stability.

Seventh, biasing the source/bulk and the drain/bulk diodes of the transistor reduces the depletion layer capacitances, which is equivalent to reducing the bit line capacitances and the source line capacitances and, therefore, permits higher switching speeds.

In the inventive method for reading nonvolatile semiconductor memory configurations, a reverse bias is applied between the bulk and the source of the transistor in a memory cell. In addition, a positive (for the NMOS) or negative (for PMOS) source or drain voltage is applied so that the drain and the source are no longer at the same potential.

Therefore, an entirely crucial factor for reading is that the source and the drain are not at the same potential. In such a context, only relative voltages are of significance for a memory cell. If, however, an entire memory cell array is considered, then there are certainly differences. The table below indicates possible variants of reading voltages for an NMOS cell, where $V_S$, $V'_S$, are the source voltage, $V_d$ is the drain voltage, and $V_B$, $V'_B$, are the bulk voltage:

| Variant | Source (S)      | Drain (D)              | Bulk (B) |
|---------|-----------------|------------------------|----------|
| (1)     | 0 V             | $V_D$                  | $V_B$    |
| (2)     | $V_S$           | $V_D + V_S$            | 0 V      |
| (3)     | $V_S + V'_B$    | $V_D + V_S + V'_B$     | $V'_B$   |

In such a context, the following relationships are true:

$V_B < 0$ V, $V_S \approx -V_B$, and $V_B < V'_B < 0$ V.

The above three voltage variants (1) to (3) represent identical conditions from the standpoint of the memory cell because the relative voltages between the electrodes S, D, B are the same. If, however, the whole memory is considered, then no bulk voltage need be applied for the variant (2). This means that, for the technology, a triple well can be dispensed with in the case of a p-doped base material, for example. If the capacitances whose charges need to be reversed when the reading conditions are set are considered, then variant (2) or, under some circumstances, a combination of variants (1) and (2), as is outlined in variant (3), is advantageous because relatively low depletion layer capacitances are present with biased pn junctions (cf. above). The presence of the source or drain voltage brings the substrate control effect to bear. As simulations have shown, the method according to the invention can prevent a drain current that would otherwise arise for conventional reading of the semiconductor memory configuration. Simulation likewise shows that, despite the low threshold voltage low $V_T$ shifted by the substrate control effect, a sufficient current still flows with a memory cell selected in the semiconductor memory configuration.

Other features that are considered as characteristic for the invention are set forth in the appended claims.

Although the invention is illustrated and described herein as embodied in a method for reading nonvolatile semiconductor memory configurations, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 6 is a curve illustrating the drain current $I_D$ as a function of the voltage on the control gate for the NMOS memory transistor of FIG. 1;

FIG. 7 is a schematic circuit diagram illustrating the method according to the invention;

FIG. 8 is a curve illustrating the drain current $I_D$ as a function of the voltage VCG on the control gate when a reverse bias is applied to the bulk; and FIG. 9 is a graph illustrating the improvement in the cycle stability by the method according to the invention.

DESCRIPTION OF THE PREFERRED EMBODIMENTS

Figure 1:
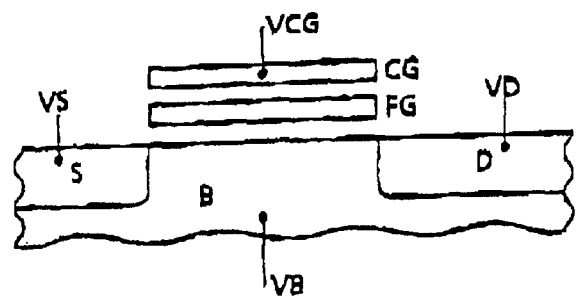
FIG. 1 is a partial, cross-sectional illustration of an NMOS memory transistor or a memory cell in the semiconductor memory configuration.

In all the figures of the drawing, sub-features and integral parts that correspond to one another bear the same reference symbol in each case.

Referring now to the figures of the drawings in detail and first, particularly to FIG. 1 thereof, there is shown a schematic cross-sectional illustration of a transistor as a memory cell in a nonvolatile semiconductor memory configuration. The transistor includes an n-conductive source zone S and an n-conductive drain zone D in a p-conductive semiconductor body or bulk B.

Above the channel region, the transistor shown in FIG. 1 also has a floating gate FG and a control gate CG, to which a control voltage VCG is applied. The source S and the drain D have a voltage VS and VD, respectively, applied to them, while a voltage VB is applied to the bulk B.

The indicated conduction types may, if appropriate, also be respectively reversed so that a p-channel MOS transistor (PMOS) is provided instead of the illustrated n-channel MOS transistor (NMOS). In such a configuration, an n-conductive bulk B then holds a p-conductive drain zone D and a p-conductive source zone S.

Figure 2:
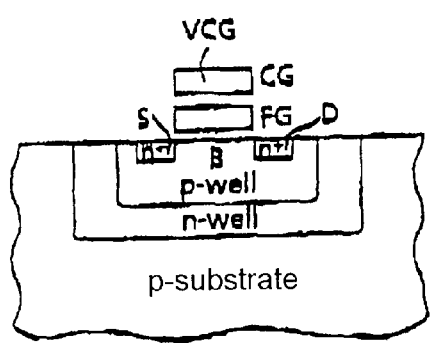
FIGS. 2 to 5 are partial, cross-sectional illustrations of well structures for memory transistors suitable for applying a bulk bias.
Figure 3:
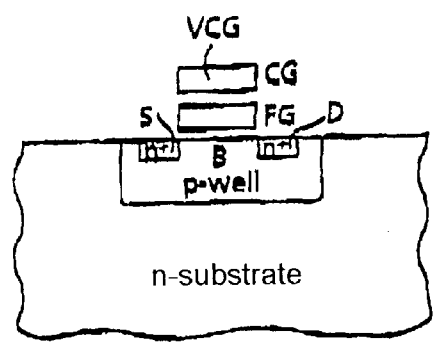
Figure 4:
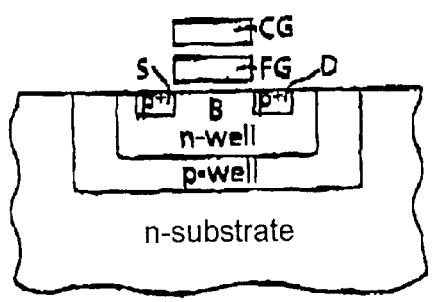
Figure 5:
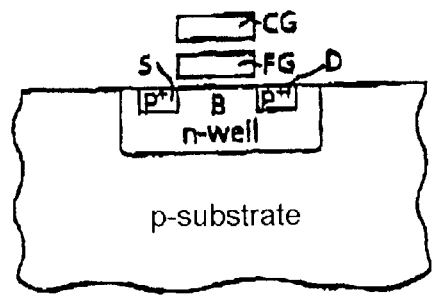

Various well structures for NMOS memory cells are shown in FIGS. 2 and 3, and various well structures for PMOS memory cells are shown in FIGS. 4 and 5. Thus, for its part, the bulk B in an NMOS memory cell may also be nested, as a p-conductive well p-well, in an n-conductive well n-well in a p-conductive silicon substrate to insulate it from adjacent memory cells, with a voltage of 0 V then being applied to the n-conductive well n-well (cf. FIG. 2). A corresponding well structure for a PMOS memory cell is shown in FIG. 4. FIGS. 3 and 5 show well structures in which the bulk is provided as a p-conductive well in an n-conductive substrate (cf. FIG. 3) or as an n-conductive well in a p-conductive substrate. Other well structures are also possible, of course.

The memory transistor shown in FIG. 1 has—like the variants indicated in FIGS. 2 to 5—different threshold voltages high $V_T$ and low $V_T$ based on the electrical charge stored in its floating gate FG, the threshold voltages each having an associated drain current $I_D$ based on the voltage VCG applied to control gate CG, as shown in FIG. 6. The window between the threshold voltages is $\Delta V_{T1}$.

For NMOS transistors, negative values of the voltage VCG cannot be used because the transistor is normally on. The same applies for positive values of the voltage VCG in PMOS transistors.

According to the invention indicated schematically in FIG. 7, a negative reverse bias $V_{SB}$=VB−VS<0 is applied between the bulk B and the source S of the NMOS transistor. In a PMOS transistor, a positive reverse bias $V_{SB}$=VB−VS>0 is applied accordingly between the bulk B and the source S. The negative (for NMOS) or positive (for PMOS) source/bulk bias shifts the threshold voltage $V_T$ by $\gamma(\sqrt{-V_{SB+2\phi_f}}-\sqrt{2\phi_f})$ for NMOS, as in the illustrative embodiment shown, for example, in FIG. 8, and by $-\gamma(\sqrt{V_{SB-2\phi_f}}-\sqrt{-2\phi_f})$ for PMOS.

As can be seen from FIG. 8, the shift in the threshold voltages low $V_T$ and high $V_T$ moves the window between the threshold voltages from $\Delta V_{T1}$. The shift allows the upper threshold voltage high $V_T$ to be lowered. The lowering ability has the advantage of providing a lower susceptibility to leakage current because there is a smaller electrical field in the oxide insulation layer.

If appropriate, the window $\Delta V_T$ can also be expanded to permit a higher cycle number. Other advantages that can be achieved with the larger window $\Delta V_T$ have already been indicated above. The enlargement of the window with $\Delta V_{T2}>\Delta V_{T1}$, is obtained when an unshifted negative threshold voltage is permitted.

FIG. 9 illustrates the gain in cycle stability as a result of expanding the window $\Delta V_{T1}$ for conventional reading to the window $\Delta V_{T2}$ for reading based on the method according to the invention. It is clearly seen that the number of cycles can be significantly increased when the method according to the invention is used.

We claim:

1. A method for reading non-volatile semiconductor memory configurations, which comprises:
    determining a high threshold and a low threshold voltage based on a charge state of a floating gate for a transistor;
    applying a reverse bias between a bulk and a source of the transistor during reading; and
    shifting a threshold voltage by $\gamma(\sqrt{-V_{SB+2\phi_f}}-\sqrt{2\phi_f})$ when the transistor is an NMOS transistor by applying the bias and shifting a threshold voltage by $-\gamma(\sqrt{V_{SB-2\phi_f}}-\sqrt{-2\phi_f})$ when the transistor is a PMOS transistor by applying the bias, where $\gamma$ is the substrate control factor, $\phi_f$ is the Fermi voltage of the bulk, and $V_{SB}$ is the bias between the bulk and the source of the transistor.

2. The method according to claim 1, which further comprises
    permitting the low threshold voltage to assume negative voltage values when the transistor is an NMOS transistor; and
    permitting the low threshold voltage to assume positive voltage values when the transistor is a PMOS transistor.

3. The method according to claim 1, which further comprises expanding the window between the high threshold voltage and the low threshold voltage by applying the reverse bias.

4. The method according to claim 1, which further comprises maintaining constant the window between the high threshold voltage and the low threshold voltage by applying the reverse bias.

5. A method for reading non-volatile semiconductor memory configurations, which comprises:
    determining a high threshold and a low threshold voltage based on a charge state of a floating gate for a transistor;
    applying a reverse bias between a bulk and a source of the transistor during reading; and
    placing each of a drain of the transistor and the source of the transistor at different potentials when the reverse bias has been applied.

6. A method for reading non-volatile semiconductor memory configurations, which comprises:
    determining a high threshold and a low threshold voltage based on a charge state of a floating gate for a transistor;
    applying a reverse bias between a bulk and a source of the transistor during reading; and
    shifting a threshold voltage by $\gamma(\sqrt{-V_{SB+2\phi_f}}-\sqrt{2\phi_f})$ when the transistor is an NMOS transistor by applying the bias, where $\gamma$ is the substrate control factor, $\phi_f$ is the Fermi voltage of the bulk, and $V_{SB}$ is the bias between the bulk and the source of the transistor.

* * * * *